United States Patent
K. et al.

(10) Patent No.: US 10,284,187 B1
(45) Date of Patent: May 7, 2019

(54) HIGH SPEED DYNAMIC COMPARATOR WITH COMMON MODE STABILIZATION

(71) Applicant: TEXAS INSTRUMENTS INCORPORATED, Dallas, TX (US)

(72) Inventors: Prasanth K., Palakkad (IN); Jagannathan Venkataraman, Bengaluru (IN); Eeshan Miglani, Chhindwara (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/884,813

(22) Filed: Jan. 31, 2018

Related U.S. Application Data

(60) Provisional application No. 62/611,664, filed on Dec. 29, 2017.

(51) Int. Cl.
*H03K 5/24* (2006.01)
*H03M 1/12* (2006.01)
*H03M 1/46* (2006.01)
*H03M 3/00* (2006.01)

(52) U.S. Cl.
CPC .......... *H03K 5/2481* (2013.01); *H03M 1/124* (2013.01); *H03M 1/46* (2013.01); *H03M 3/458* (2013.01)

(58) Field of Classification Search
USPC .................................................. 341/162–163
See application file for complete search history.

(56) References Cited

U.S. PATENT DOCUMENTS 8,581,770 B2 * 11/2013 Wang .................. H03M 1/1295
341/163

OTHER PUBLICATIONS

Shubhanand et al., Design and Simulation of a High Speed CMOS Comparator, International Journal of Electronics and Communication Engineering. ISSN 0974-2166 vol. 6, No. 1 (2013), pp. 75-80, © International Research Publication House (Year: 2013).*

* cited by examiner

*Primary Examiner* — Howard Williams
(74) *Attorney, Agent, or Firm* — John R. Pessetto; Charles A. Brill; Frank D. Cimino

(57) ABSTRACT

A comparator includes a differential input pair of transistors, a pair of cross coupled n-channel metal-oxide-semiconductor field-effect (NMOS) transistors, a pair of p-channel metal-oxide semiconductor field-effect (PMOS) transistors, a first inverter, and a second inverter. The differential input pair of transistors includes a first input transistor and a second input transistor. The pair of cross coupled NMOS transistors includes a first NMOS transistor and a second NMOS transistor. The pair of PMOS transistors includes a first PMOS transistor and a second PMOS transistor. The pair of PMOS transistors are coupled to the pair of cross coupled NMOS transistors. The first inverter is coupled in series with the first PMOS transistor. The second inverter is coupled in series with the second PMOS transistor.

12 Claims, 2 Drawing Sheets

HIGH SPEED DYNAMIC COMPARATOR WITH COMMON MODE STABILIZATION

CROSS-REFERENCE TO RELATED APPLICATIONS

The present application claims priority to U.S. Provisional Patent Application No. 62/611,664, filed Dec. 29, 2017, titled "High Speed Dynamic Comparator with Common Mode Stabilization," which is hereby incorporated herein by reference in its entirety.

BACKGROUND

Analog comparators are relatively common electronic circuits that are used in a wide-variety of applications to measure the amplitudes of signals. Latched comparators are a type of comparator that use positive feedback to generate and maintain an output state of the comparator. For example, depending on the input to the comparator, output state change of a latched comparator may be triggered by a transition or state of a clock signal. After the output state change, the output state of the comparator is maintained by positive feedback and the remainder of the comparator circuitry may operate at a reduced power level. Latched comparators are often used in event driven or power sensitive applications, such as analog-to-digital converters (ADCs).

SUMMARY

In accordance with at least one aspect of the disclosure, a comparator includes a differential input pair of transistors, a pair of cross coupled n-channel metal-oxide-semiconductor field-effect (NMOS) transistors, a pair of p-channel metal-oxide semiconductor field-effect (PMOS) transistors, a first inverter, and a second inverter. The differential input pair of transistors includes a first input transistor and a second input transistor. The pair of cross coupled NMOS transistors includes a first NMOS transistor and a second NMOS transistor. The pair of PMOS transistors includes a first PMOS transistor and a second PMOS transistor. The pair of PMOS transistors are coupled to the pair of cross coupled NMOS transistors. The first inverter is coupled in series with the first PMOS transistor. The second inverter is coupled in series with the second PMOS transistor.

Another aspect of the disclosure is an ADC that includes a sample and hold circuit, a comparator, a successive approximation register (SAR) circuit, and a digital-to-analog converter (DAC). The sample and hold circuit is configured to receive an analog input signal and generate a sampled analog signal. The comparator is configured to receive the sampled analog input signal and generate a comparator output signal. The comparator includes a differential input pair of transistors, a pair of cross coupled NMOS transistors, a pair of PMOS transistors, a first inverter, and a second inverter. The differential input pair of transistors includes a first input transistor and a second input transistor. The pair of cross coupled NMOS transistors includes a first NMOS transistor and a second NMOS transistor. The pair of PMOS transistors includes a first PMOS transistor and a second PMOS transistor. The pair of PMOS transistors are coupled to the pair of cross coupled NMOS transistors. The first inverter is coupled in series with the first PMOS transistor. The second inverter is coupled in series with the second PMOS transistor. The SAR circuit is configured to receive the comparator output signal and generate a digital code. The DAC is configured to receive an analog reference signal, generate a comparison signal corresponding with the digital code and the analog reference signal, and provide the comparison signal to the comparator.

Yet another aspect of the disclosure is a comparator that includes a differential input pair of transistors, a pair of modified back-to-back inverters, a first inverter, and a second inverter. The differential input pair of transistors includes a first transistor and a second transistor. The pair of modified back-to-back inverters is coupled to the first input transistor and the second input transistor. The pair of modified back-to-back inverters includes a first PMOS transistor that includes a first gate, a first source, and a first drain. The pair of modified back-to-back inverters also includes a second PMOS transistor that includes a second gate, a second source, and a second drain. The pair of modified back-to-back inverters also includes a first NMOS transistor that includes a third gate, a third source, and a third drain. The third drain is connected to the first drain. The pair of modified back-to-back inverters also includes a second NMOS transistor that includes a fourth gate, a fourth source, and a fourth drain. The fourth drain is connected to the second drain. The first inverter is coupled in series with the first PMOS transistor. The second inverter is coupled in series with the second PMOS transistor.

BRIEF DESCRIPTION OF THE DRAWINGS

For a detailed description of various examples, reference will now be made to the accompanying drawings in which.

NOTATION AND NOMENCLATURE

Figure 1:
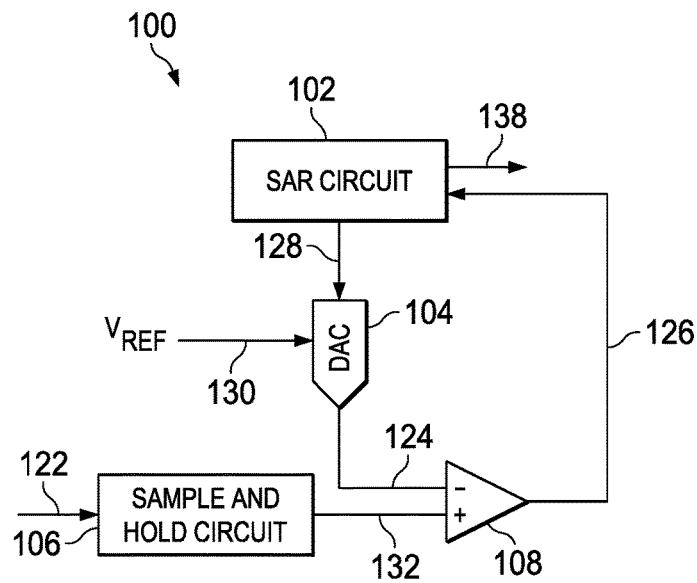
FIG. 1 shows an illustrative block diagram of a SAR ADC in accordance with various examples.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections. The recitation "based on" is intended to mean "based at least in part on." Therefore, if X is based on Y, X may be based on Y and any number of other factors.

DETAILED DESCRIPTION

The following discussion is directed to various examples of the disclosure. Although one or more of these examples may be preferred, the examples disclosed should not be interpreted, or otherwise used, as limiting the scope of the disclosure, including the claims. In addition, one skilled in the art will understand that the following description has broad application, and the discussion of any example is meant only to be exemplary of that example, and not intended to intimate that the scope of the disclosure, including the claims, is limited to that example.

ADCs are used to convert analog signals into a digital representation of the same signal. ADCs are used in a wide variety of applications, ranging from medical and entertainment to communications (both voice and data). One key design block of any ADC is the comparator. The comparator generates digital output signals based on the comparison of an analog input signal with a reference voltage.

For example, in a SAR ADC, the comparator compares a sampled analog input signal to the analog output of an internal DAC and outputs a digital output signal to a SAR circuit that generates a digital code of the analog input signal voltage which is provided to the DAC. The SAR circuit is initialized so that the most significant bit (MSB) is equal to digital one. This digital code is output into the DAC which converts the digital code into an analog equivalent based on a reference signal. The DAC's analog output is then received by the comparator. If the analog input signal has a voltage that is greater than the voltage of the DAC's analog output, the comparator will output a HIGH signal (thus causing the SAR to keep the MSB as one); however, if the analog signal has a voltage that is less than the voltage of the DAC's analog output, the comparator will output a LOW signal (thus causing the SAR to reset the MSB as zero). Each bit in the SAR is tested in a similar manner against the analog input signal by the comparator until every bit has been set. The resulting code is output as the digital output signal that represents the analog input signal. Comparators are similarly important in sigma-delta modulated ADCs, flash ADCs, high speed radio frequency (RF) sampling converters, etc.

Because the comparator is essential to ADCs, the speed of the comparator affects the speed of the entire ADC. In other words, by increasing the speed of the comparator, the speed of the ADC may also be increased. For example, the comparator used in the ADC takes a finite time to convert the analog input signal to a rail to rail output. This time is dependent upon the regeneration time constant of the comparator. Hence, metastability in the comparator may occur when the ADC has a relatively low conversion time, thus, increasing bit error rate (BER) in the ADC. Therefore, the speed at which the comparator can convert the input signal to a rail to rail output provides a lower limit on the conversion time required, thereby limiting the speed of the ADC. In conventional systems, improving the regeneration time constant (e.g., lowering the regeneration time constant) of the comparator usually requires a power penalty.

Some conventional high speed ADCs use dynamic latch circuits with back-to-back inverters (e.g., two cross coupled PMOS transistors (a PMOS regeneration pair) stacked above to two cross coupled NMOS transistors (a NMOS regeneration pair)) that are used to regenerate a small analog signal to a rail to rail signal. However, the PMOS transistors are typically weaker than the NMOS transistors; therefore, the performance of the latch is limited because the capacitance at the regeneration node (the node between one of the PMOS transistors and one of the NMOS transistors) is increased. In other words, because the capacitance at the regeneration node is increased in these conventional comparators, the regeneration time constant ($\tau \propto c_{out}/g_m$) increases, thereby slowing the entire ADC. Conventional dynamic latch comparators are also speed restrained because the NMOS regeneration pair and the PMOS regeneration pair have a relatively low overdrive due to the common mode of the regeneration node being typically mid-supply. Therefore, there is a need for a high speed comparator that has a relatively low regeneration time constant without a power penalty and without being susceptible to common mode instability.

In accordance with various examples, a relatively high speed comparator is provided with an improved regeneration time constant with respect to conventional comparators with a minimized power dissipation. A series inverter is added in the path of each PMOS transistor of the PMOS regeneration pair. The size of each PMOS transistor is smaller than the conventional system PMOS transistor, and each series inverter is skewed to provide a large overdrive for the NMOS transistors of the NMOS regeneration pair, thus improving the regeneration time constant. However, the addition of the series inverters can cause common mode instability due to a positive common mode feedback in each PMOS transistor—series inverter path. Therefore, an auxiliary cross coupled NMOS pair of transistors can be added at the output of the series inverters, thereby removing any common mode instability and acting as a differential regenerative pair due to the negative differential impedance offered by it, thus improving differential regeneration. The output signal of the converter is taken from the series inverters output, thus isolating the output load and the regeneration node. This enables direct driving of the load without building drive strength. The comparator can be reset at the series inverters output to reduce parasitic capacitance at the internal regeneration nodes of the comparator.

FIG. 1 shows an illustrative block diagram of a SAR ADC 100 in accordance with various examples. The SAR ADC 100 includes, in an embodiment, SAR circuit 102, DAC 104, sample and hold circuit 106, and comparator 108. Sample and hold circuit 106 is configured, in an embodiment, to receive an analog input signal 122 and generate a sampled analog input signal 132. More particularly, the sample and hold circuit 106 is configured to sample the voltage of the analog input signal 122 (e.g., a time-varying analog voltage) at specified time periods and hold the signal at the sample time at a constant voltage level for a specified period of time as the sampled analog input signal 132. In other words, the sampled analog input signal 132 is the analog input signal 122 at a constant voltage for a specified period of time defined by the sample frequency. In this way, the sampled analog input signal 132 corresponds with the analog input signal 122.

The SAR circuit 102 includes circuitry that controls the various components of the SAR ADC 100 to manage conversion of the analog input signal 122 into a digital output signal 138. For example, the successive approximation control circuitry 102 can include a state machine that generates control signals for the DAC 104, the comparator 108, and/or other components of the SAR ADC 100. The successive approximation control circuitry 102 also includes a successive approximation register that stores bit values generated during digitization. This digital code 128 is fed into DAC 104. The DAC 104 generates the analog equivalent of the digital code 128 (e.g., for the digital code 1, the reference voltage divided by 2) as the comparison signal 124. Thus, the DAC 104 is configured to receive the digital code 128 and an analog reference signal 130, generate an analog comparison signal 124 that corresponds with the digital code 128 and the analog reference signal 130. The DAC 104 then may provide the comparison signal 124 to the comparator 108.

For example, SAR circuit 102 is initialized so that the MSB is equal to digital one which is the digital code 128. The digital code 128 is received by the DAC 104 which generates the analog equivalent of the digital code 128 (e.g., voltage of the reference signal 130 divided by 2) as the comparison signal 124. The comparator 108 then is provided with the comparison signal 124. The comparator 108 compares the comparison signal 124 with the sampled analog input signal 132. If the comparison signal 124 is greater than the sampled analog input signal 132, the comparator 108 generates a comparator output signal 126 that causes the SAR circuit to reset the MSB. However, if the comparison signal 124 is less than the sampled analog input signal 132, the comparator 108 generates a comparator output signal 126 that causes the SAR to keep the MSB as one. The next bit is then set to one and the process continues, with different weights applied to the voltage of the reference signal 130 depending on the bit, until all of the bits in the SAR circuit 102 are compared. The resulting digital output signal 138 is generated by the SAR circuit 102.

Figure 2:
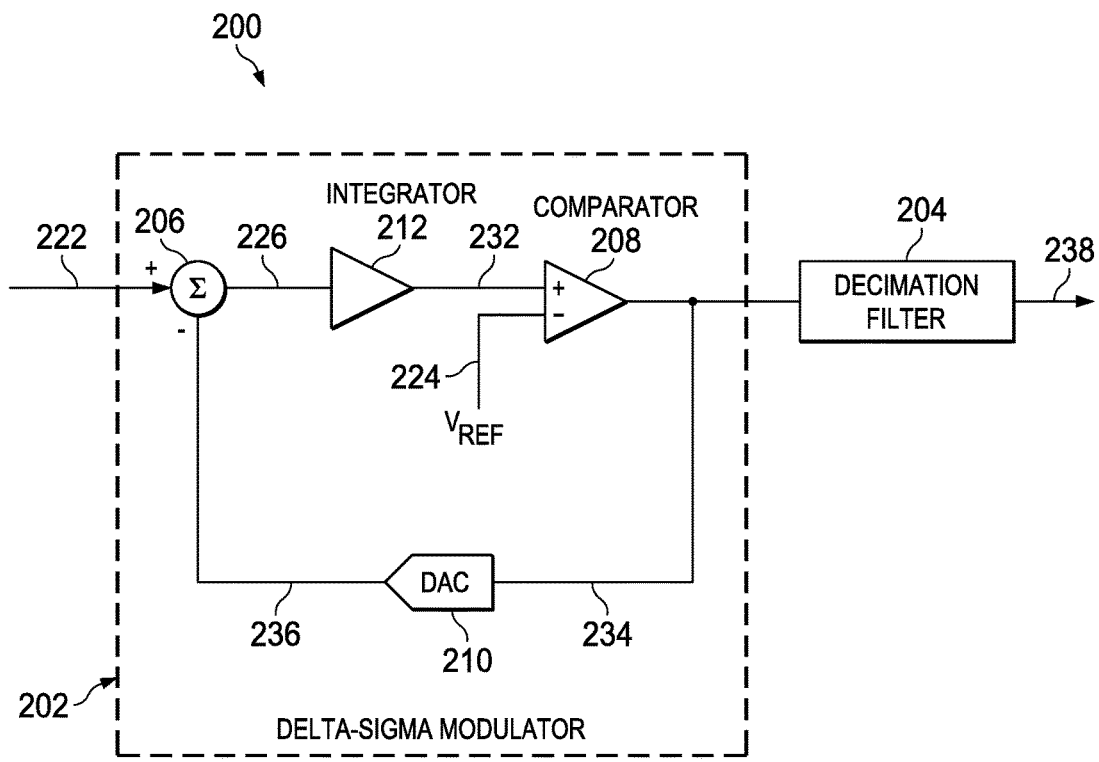
FIG. 2 shows an illustrative block diagram of a delta-sigma ADC in accordance with various examples.

FIG. 2 shows an illustrative block diagram of a delta-sigma ADC 200 in accordance with various examples. The delta-sigma ADC 200 includes, in an embodiment, a delta-sigma modulator 202 and a decimation filter 204. The delta-sigma modulator 202, includes a summation circuit 206, an integrator 212, a comparator 208, and a DAC 210. The summation circuit 206 is configured to receive an analog input signal 222 (e.g., a time-varying analog voltage) and an analog feedback signal 236 which is an analog version of the comparator output signal 234. The summation circuit 206 is further configured to subtract the analog feedback signal 236 from the analog input signal 222 to generate the summed analog signal 226. The integrator 212 receives and integrates the summed analog signal 226 to generate an integrated signal 232 (e.g., a ramp signal with a slope that is proportional to the summed analog signal 226, or any other integrated signal). While only one integrator 212 is shown in FIG. 2, in some examples, the delta-sigma modulator 202 can include any number of integrators depending on the order of the delta-sigma modulator 202. The comparator 208, which in an embodiment, is structurally similar to the comparator 108 in FIG. 1, is configured to compare, at a sampling instant, the integrated signal 232 with a reference signal 224 and generate a digital comparator output signal 234. For example, if the integrated signal 232, which corresponds with the analog input signal 222, has a voltage that is greater than the voltage of the reference signal 224 at the sampling instant, the comparator 208 will output a HIGH signal as the digital comparator output signal 234; however, if the integrated signal 232 has a voltage that is less than the voltage of the reference signal 224 at the sampling instant, the comparator 208 will output a LOW signal as the digital comparator output signal 234. While only one comparator 208 is shown in FIG. 2, in some examples, the delta-sigma modulator 202 can include any number of comparators (e.g., in a flash-like structure). The DAC 210 receives the digital comparator output signal 234 and generates an analog version of the digital comparator output signal 234 as the analog feedback signal 236.

Decimation filter 204 which is, in an embodiment, an electric circuit that is configured to filter the digital comparator output signal 234 to attenuate high frequency out of band noise in the digital comparator output signal 234 and then decimate the filtered output for a given rate, thus, generating a high resolution digital output signal 238. In summary, as shown in FIGS. 1 and 2, the comparator 108 (from FIG. 1) and the comparator 208 (from FIG. 2) are important to the operation of an ADC.

Figure 3:
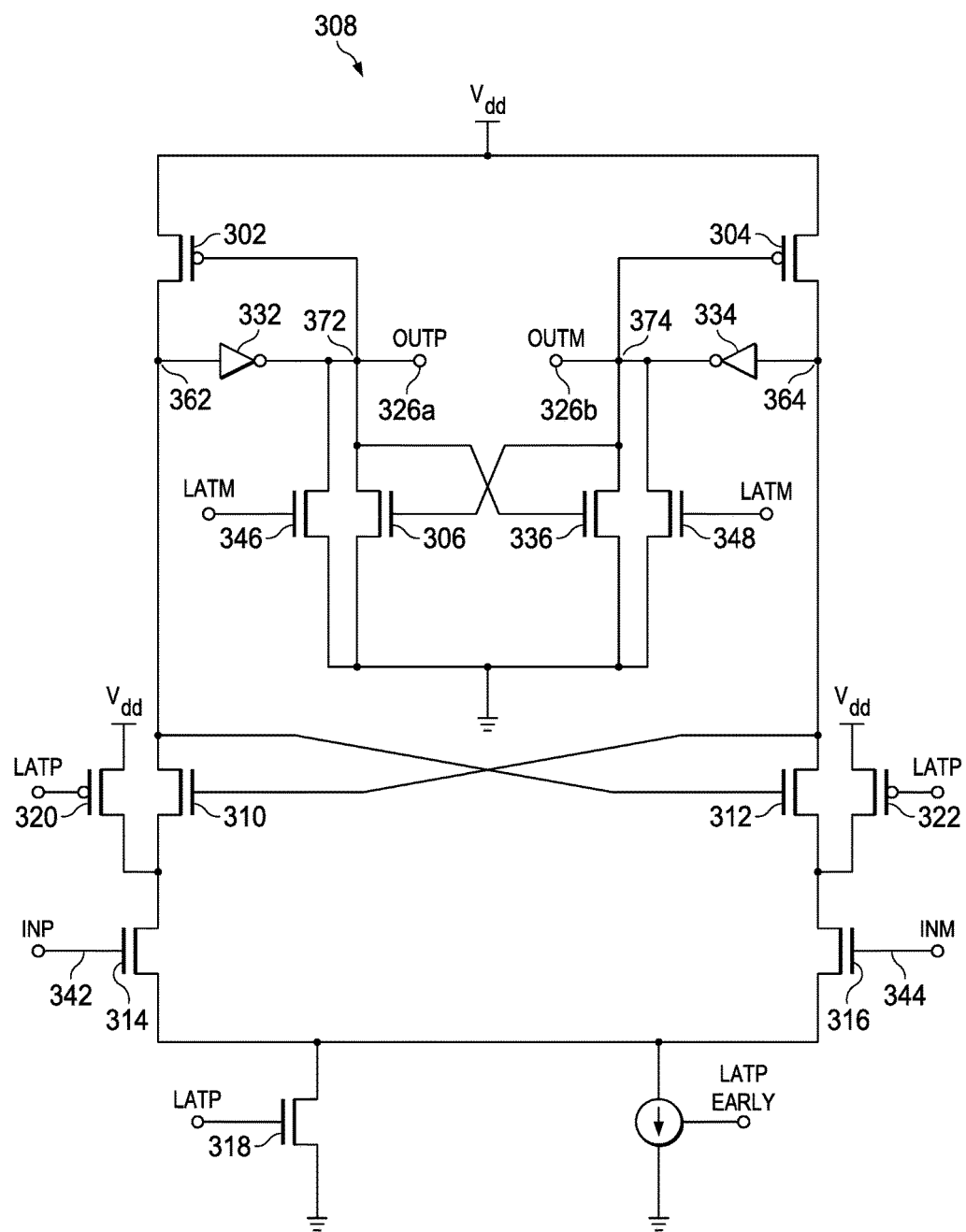
FIG. 3 shows an illustrative circuit diagram for a comparator in accordance with various examples.

FIG. 3 shows an illustrative circuit diagram for a comparator 308 in accordance with various examples. The components of comparator 308 can, in some embodiments, be utilized as the comparator 108 and/or the comparator 208. In other embodiments, the comparator 308 can be used in any type of circuit including any type of ADC (e.g., a flash ADC), high speed sampling converter, etc. The comparator 308 includes, in an embodiment, a differential input pair of transistors that includes transistors 314-316, a pair of modified back-to-back inverters, one of which includes transistors 302 and 310, the second of which includes transistors 304 and 312, inverters 332-334, cross coupled transistors 306 and 336, clock transistors 318-322, and a pair of reset transistors 346-348. The clock transistors 318-322 are configured in an embodiment, to receive a clock signal, such as clock signal LATP that is configured to provide a clock for the operation of the comparator 308 and reset the drains of transistors 314-316. The reset transistors 346-348 are configured to receive a clock signal, such as clock signal LATM that provides a clock to reset the output signals 326a and 326b of the comparator 308. For example, the transistor 346 is configured, in an example, to reset the output signal 326a at the output of inverter 332, and transistor 348 is configured, in an example, to reset the output signal 326b at the output of inverter 334.

Each of the input pair of transistors 314-316 is coupled to a pair of cross coupled transistors 310-312. The cross coupled transistors 310-312 and the input pair of transistors 314-316 are, in an embodiment, NMOS transistors. The cross coupled transistors 310-312 are coupled to another pair of transistors 302-304. The transistors 302-304 are, in an embodiment, PMOS transistors. In some embodiments, the size of the transistors 302-304 are relatively small (e.g., smaller than conventional comparator PMOS transistors and smaller than the transistors 310-312). Because the transistors 302-304 are smaller than the transistors 310-312, in an example, differential regeneration is improved. The inverter 332 is coupled in series with the transistor 302 while the inverter 334 is coupled in series with transistor 304. In some examples, the inverters 332-334 are skewed thereby providing a relatively large overdrive to the transistors 310-312. Furthermore, by adding the inverter 332 in series with the transistor 302, the capacitance at node 362 (a regeneration node) is much less than the capacitance at node 372, and by adding the inverter 334 in series with the transistor 304, the capacitance at node 364 is much less than the capacitance at node 374. The time constant of comparator 308 is $\tau \propto c_p/g_m$, where $c_p$ is the capacitance at the node 362 or the capacitance at the node 364 (a regeneration node). Therefore, because, the capacitance at the node 362 or the node 364 is much lower than the capacitance at the node 372 or the node 374 (e.g., the output capacitance), the time constant of comparator 308 is reduced when compared to conventional comparators. The comparator 308 output is provided by the output of the inverters 332 and 334. More particularly, the comparator 308 can output a differential output signal with the negative output signal (OUTM) 326b being the output of the inverter 334 and the positive output signal (OUTP) 326a being the output of the inverter 332. By having the comparator 308 output at the output of the inverters 332-334 (and thus the output signals 326a-326b being reset by the reset transistors 346-348 at the output of the inverters 332-334), the parasitic capacitance at the regeneration nodes 362 and 364 is reduced.

More particularly, the source of transistor 302 is connected to the source of transistor 304 and to a supply voltage Vdd. The drain of the transistor 302 is connected to the input of the inverter 332, the drain of transistor 310 and the gate of transistor 312. The drain of transistor 304 is connected to the input of the inverter 334, the drain of transistor 312, and the gate of transistor 310. Therefore, the drain of transistor 310 is connected to the gate of transistor 312, and the drain of transistor 312 is connected to the gate of transistor 310. The source of transistor 310 is connected to the drain of input transistor 314, and the source of transistor 312 is connected to the drain of input transistor 316. The source of input transistor 314 is connected to the source of input transistor 316 and the drain of transistor 318. The gate of input transistor 314 is configured to receive an analog input signal 342 to the comparator 308, such as the sampled analog input signal 132 and/or the integrated signal 232 (or any other analog signal). The gate of input transistor 316 is configured to receive an analog reference signal 344, such as the comparison signal 124 and/or the reference signal 224 (or any other analog reference signal). The gate of transistor 318 is configured to receive the clock signal LATP, and the source of transistor 318 is connected to ground. Therefore, the input transistors 314 and 316 are coupled to ground through transistor 318.

However, the inverters 332 and 334 can, in some embodiments, cause common mode instability due to a positive common mode feedback in the path of the transistors 302 and 304. Therefore, in some embodiments, a pair of auxiliary cross coupled transistors 306 and 336 are connected to the inverters 332-334 output. The auxiliary cross coupled transistors 306 and 336 are, in an embodiment, NMOS transistors.

More particularly, the gate of transistor 306 is connected to the drain of transistor 336 and to the output of inverter 334. The gate of transistor 336 is connected to the drain of transistor 306 and the output of inverter 332. The source of transistor 306 is connected to the source of transistor 336 and to ground. The output of the inverters 332-334 provide the output signals 326a-326b for the entire comparator 308. In other words, the load for the comparator 308 is taken from the auxiliary cross-coupled pair of transistors 306 and 336 instead of the main latch which makes the main latch faster by isolating the output load (e.g., nodes 372-374) from the regeneration node (e.g. nodes 362-364). This also reduces the capacitance at the nodes 362-364. Because the output load is isolated from the regeneration load (e.g., nodes 362-364), the modified back-to-back inverters that are comprised of transistors 302-304 and 310-312 need not be built to drive the final load (e.g., may be smaller transistors), therefore, the power dissipation and delay of the comparator 308 is reduced compared to conventional comparators.

The above discussion is meant to be illustrative of the principles and various examples of the present disclosure. Numerous variations and modifications will become apparent to those skilled in the art once the above disclosure is fully appreciated. It is intended that the following claims be interpreted to embrace all such variations and modifications.

What is claimed is:

1. A comparator, comprising:
    a differential input pair of transistors including a first input transistor and a second input transistor;
    a first pair of cross coupled transistors including a first transistor and a second transistor;
    a second pair of transistors including a third transistor and a fourth transistor, the second pair of transistors coupled to the first pair of cross coupled transistors;
    a first inverter coupled in series with the third transistor; and
a second inverter coupled in series with the fourth transistor;
    wherein the first transistor comprises a first n-channel metal oxide semiconductor field effect (NMOS) transistor, the second transistor comprises a second NMOS transistor, the third transistor comprises a third D-channel metal oxide semiconductor field effect (PMOS) transistor, and the fourth transistor comprises a fourth PMOS transistor;
    further comprising a pair of auxiliary cross coupled NMOS transistors connected to an output of the first inverter and an output of the second inverter, the pair of auxiliary cross coupled NMOS transistors including a first auxiliary NMOS transistor and a second auxiliary NMOS transistor.

2. The comparator of claim 1, wherein the output of the first inverter and the output of the second inverter generate an output signal of the comparator.

3. The comparator of claim 2, further comprising a pair of reset transistors configured to reset the output signal of the comparator at the output of the first inverter and the output of the second inverter.

4. The comparator of claim 3, wherein:
    the first auxiliary NMOS transistor includes a third gate, a third source, and a third drain;
    the second auxiliary NMOS transistor includes a fourth gate, a fourth source, and a fourth drain;
    the third drain is connected to the output of the first inverter, the first gate, and the fourth gate; and
    the fourth drain is connected to the output of the second inverter, the second gate, and the third gate.

5. The comparator of claim 4, wherein:
    the first NMOS transistor includes a fifth gate, a fifth source, and a fifth drain;
    the second NMOS transistor includes a sixth gate, a sixth source, and a sixth drain;
    the fifth drain is connected to the input of the first inverter and the sixth gate; and
    the sixth drain is connected to the input of the second inverter and the fifth gate.

6. The comparator of claim 5, wherein the seventh gate is configured to receive an analog input signal and the eighth gate is configured to receive an analog reference signal.

7. The comparator of claim 1, wherein:
    the third PMOS transistor includes a first gate, a first source, and a first drain;
    the fourth PMOS transistor includes a second gate, a second source, and a second drain;
    the first drain is connected to an input of the first inverter; and
    the second drain is connected to an input of the second inverter.

8. The comparator of claim 7, wherein:
    the first source and the second source are coupled to a supply signal; and
    the third source and the fourth source are coupled to ground.

9. The comparator of claim 8, wherein:
    the first input transistor includes a seventh gate, a seventh source, and seventh drain;
    the second input transistor includes an eighth gate, an eighth source, and an eighth drain;
    the seventh drain is connected to the fifth source; and
    the eighth drain is connected to the sixth source.

10. The comparator of claim 9, wherein the first NMOS transistor and the second NMOS transistor are larger than the third PMOS transistor and the fourth PMOS transistor.

11. An analog-to-digital converter (ADC), comprising:
    a sample and hold circuit configured to receive an analog input signal and generate a sampled analog input signal;

a comparator configured to receive the sampled analog input signal and generate a comparator output signal, the comparator including:
- a differential input pair of transistors including a first input transistor and a second input transistor;
- a pair of cross coupled n-channel metal-oxide-semiconductor field-effect (NMOS) transistors including a first NMOS transistor and a second NMOS transistor;
- a pair of p-channel metal-oxide-semiconductor field-effect (PMOS) transistors including a first PMOS transistor and a second PMOS transistor, the pair of PMOS transistors coupled to the pair of cross coupled NMOS transistors;
- a first inverter coupled in series with the first PMOS transistor; and
- a second inverter coupled in series with the second PMOS transistor:

a successive approximation register (SAR) circuit configured to receive the comparator output signal and generate a digital code; and a digital-to-analog converter (DAC) configured to receive an analog reference signal, generate a comparison signal corresponding with the digital code and the analog reference signal, and provide the comparison signal to the comparator;

wherein the comparator further includes a pair of auxiliary cross coupled NMOS transistors connected to an output of the first inverter and an output of the second inverter, the pair of auxiliary cross coupled NMOS transistors including a first auxiliary NMOS transistor and a second auxiliary NMOS transistor.

12. A comparator, comprising:

a differential input pair of transistors including a first input transistor and a second input transistor;

a pair of modified back-to-back inverters coupled to the first input transistor and the second input transistor, the pair of modified back-to-back inverters including:
- a first p-channel metal-oxide-semiconductor field-effect (PMOS) transistor that includes a first gate, a first source, and a first drain;
- a second PMOS transistor that includes a second gate, a second source, and a second drain;
- a first n-channel metal-oxide-semiconductor field-effect (NMOS) transistor that includes a third gate, a third source, and a third drain, the third drain connected to the first drain; and
- a second NMOS transistor that includes a fourth gate, a fourth source, and a fourth drain, the fourth drain connected to the second drain; and a first inverter coupled in series with the first PMOS transistor; and a second inverter coupled in series with the second PMOS transistor;

further comprising a pair of auxiliary cross coupled NMOS transistors connected to an output of the first inverter and an output of the second inverter, the pair of auxiliary cross coupled NMOS transistors including a first auxiliary NMOS transistor and a second auxiliary NMOS transistor.

* * * * *